(12) United States Patent
Tran et al.

(10) Patent No.: US 12,132,294 B2
(45) Date of Patent: Oct. 29, 2024

(54) MANUFACTURING METHOD FOR LASER CHIP AND LASER CHIP

(71) Applicant: SHENZHEN LIGHTING INSTITUTE, Shenzhen (CN)

(72) Inventors: Anh Chuong Tran, Shenzhen (CN); Chao-Chen Cheng, Shenzhen (CN)

(73) Assignee: SHENZHEN LIGHTING INSTITUTE, Shenzhen (CN)

( * ) Notice: Subject to any disclaimer, the term of this patent is extended or adjusted under 35 U.S.C. 154(b) by 740 days.

(21) Appl. No.: 17/414,055

(22) PCT Filed: Dec. 11, 2019

(86) PCT No.: PCT/CN2019/124466
§ 371 (c)(1),
(2) Date: Jun. 15, 2021

(87) PCT Pub. No.: WO2020/119702
PCT Pub. Date: Jun. 18, 2020

(65) Prior Publication Data
US 2022/0136125 A1 May 5, 2022

(30) Foreign Application Priority Data
Dec. 15, 2018 (CN) .......................... 201811537765.3

(51) Int. Cl.
*H01S 5/00* (2006.01)
*H01S 3/0941* (2006.01)
(Continued)

(52) U.S. Cl.
CPC ........ *H01S 5/02423* (2013.01); *H01S 3/0941* (2013.01); *H01S 5/02407* (2013.01);
(Continued)

(58) Field of Classification Search
CPC .............. H01S 5/02423; H01S 3/0941; H01S 5/02407; H01S 5/4031
See application file for complete search history.

(56) References Cited

U.S. PATENT DOCUMENTS 6,143,650 A * 11/2000 Pramanick ........ H01L 21/76876
  438/643
6,167,072 A * 12/2000 Zory, Jr. .................. H01S 5/22
  372/72

(Continued)

FOREIGN PATENT DOCUMENTS

CN       103700752 A      4/2014
WO       2012174950 A1   12/2012

*Primary Examiner* — Kinam Park
(74) *Attorney, Agent, or Firm* — ScienBiziP, P.C.

(57) ABSTRACT

Disclosed are a manufacturing method for a laser chip and a laser chip. The manufacturing method comprises: step S1, forming a first electroplating substrate on an epitaxial layer; step S2, forming an organic pattern layer on the first electroplating substrate, wherein the pattern layer defines a hollowed-out area and a part of the first electroplating substrate is exposed to the pattern layer by means of the hollowed-out area; step S3, forming a first metal coating on the first electroplating substrate, wherein the first metal coating completely covers the pattern layer and the part of the first electroplating substrate not covered by the pattern layer; and step S4, removing the pattern layer to have a hollow channel formed between the first metal coating and the first electroplating substrate, wherein the channel is provided with at least one inlet and at least one outlet running through the first metal coating.

10 Claims, 14 Drawing Sheets

(51) Int. Cl.
*H01S 5/024* (2006.01)
*C25D 1/02* (2006.01)
*C25D 5/02* (2006.01)
*C25D 15/00* (2006.01)
*H01S 5/40* (2006.01)

(52) U.S. Cl.
CPC ............... *C25D 1/02* (2013.01); *C25D 5/02* (2013.01); *C25D 15/00* (2013.01); *H01S 5/4031* (2013.01)

(56) References Cited

U.S. PATENT DOCUMENTS

| | | | |
|---|---|---|---|
| 2003/0116843 A1* | 6/2003 | Iijima | H01L 24/05 257/700 |
| 2011/0155439 A1* | 6/2011 | Yamada | H05K 3/4652 29/852 |
| 2012/0133080 A1* | 5/2012 | Moussa | B29C 64/112 264/308 |
| 2014/0169394 A1* | 6/2014 | Schleuning | H01S 5/02476 372/35 |
| 2018/0226310 A1* | 8/2018 | Eid | H01L 23/473 |

* cited by examiner

MANUFACTURING METHOD FOR LASER CHIP AND LASER CHIP

TECHNICAL FIELD

The present disclosure relates to a field of optical technology, in particular to a manufacturing method for laser chip and a laser chip manufactured by applying the manufacturing method for laser chip.

BACKGROUND

A semiconductor laser-pumped all-solid-state laser is a novel laser emerging in the late 1980s. The efficiency of a laser pump of the semiconductor laser-pumped all-solid-state laser is at least 10 times higher than that of a lamp pump, and higher power can be obtained due to the reduced thermal load per unit output, and the life and reliability of the system are about 100 times that of flash lamp-pumped systems. Therefore, the semiconductor laser pumping technology has injected new vitality and vigor into solid-state lasers, so that solid-state lasers have dual characteristics of both solid-state lasers and semiconductor lasers, and its appearance and development become a revolution in solid-state lasers, and also become the development direction of solid-state lasers. Moreover, it has penetrated into various disciplines, such as: laser information storage and processing, laser material processing, laser medicine and biology, laser communication, laser printing, laser spectroscopy, laser chemistry, laser separation of isotopes, laser nuclear fusion, laser projection display, laser detection and metrology, and military laser technology, etc., thereby greatly promoting the technological progress and unprecedented development of these fields.

The semiconductor line array laser for the side pumping source on the market often needs to be paired with a heat sink, to improve the cooling efficiency of the semiconductor laser. An existing laser and heat structure are as shown in FIG. 1, including a plurality of laser chips and a clamping board 31 and a clamping board 32 for clamping the laser chips, wherein each laser chip contains a heat sink substrate 1 and a laser bar 2 arranged on the heat sink substrate 1, and further contains a clamping part 33 and a fixing member 34. Wherein, the clamping board 31 and the clamping board 32 are thermal conductive clamping board, wherein the clamping board 32 is internally provided with heat dissipation micropipes for fluid to pass through, the heat dissipation micropipes are used for communicating with the external liquid cooling source, to achieve liquid circulation and heat dissipation. The current problem with this structure is that the thermal conductive clamping board requires additional assembly, which not only increases the manufacturing cost of the laser, but also makes the volume of the laser larger, which is not conducive to the application of lasers in the field of micro devices.

SUMMARY OF THE INVENTION

Aiming at the above technical problems, it is necessary to provide a manufacturing method for laser chip and a laser chip with smaller size and better heat dissipation effect.

The present disclosure provides, on the one hand, a manufacturing method for laser chip, including the following steps:

step S1, forming a first electroplating layer on an epitaxial layer;

step S2, forming a pattern layer on the first electroplating layer, the pattern layer defining a hollowed-out area, a portion of the first electroplating layer being exposed from the hollowed-out area relative to the pattern layer;

step S3, forming a first metal coating on the first electroplating layer, the first metal coating completely covering the pattern layer and the first electroplating layer not covered by the pattern layer; and step S4, removing the pattern layer to form a hollow micropipe between the first metal coating and the first electroplating layer, the micropipe having at least one inlet and at least one outlet penetrating through the first metal coating.

The present disclosure, on the other hand, provides a laser chip, including:

an epitaxial layer;

a first electroplating layer on the epitaxial layer; and a first metal coating on the first electroplating layer, a hollow micropipe being between the first metal coating and the first electroplating layer, and the micropipe having at least one inlet and at least one outlet penetrating through the first metal coating.

In the manufacturing method for laser chip provided by the embodiment of the present disclosure, by making a first metal coating on the epitaxial layer and forming a pattern layer in the first metal coating and then removing the pattern layer, a micropipe is formed in the first metal coating, and the micropipe penetrates through the first metal coating, then the micropipe is used as a space for circulating liquid to flow, and the heat generated by the laser chip is exported by circulating liquid, and the laser chip made by the manufacturing method for laser chip is also conducive to improving the heat dissipation effect of the laser chip on the basis of ensuring a controllable overall volume.

DESCRIPTION OF MAIN ELEMENT SYMBOLS

| Laser chip master | 100 |
| Laser chip | 200 |
| Epitaxial layer | 110 |
| First electroplating layer | 120 |
| First seed layer | 122 |
| Second metal coating | 124 |
| Pattern layer | 130 |
| Micropipe | 131 |
| Inlet | 1311 |
| Outlet | 1312 |
| Hollowed-out area | 132 |
| First metal coating | 150 |
| First sub-electroplating layer | 151 |
| Second seed layer | 152 |
| Second sub-electroplating layer | 153 |
| Notch | 154 |
| Film layer | 160, 170 |
| Cutting end face | S |
| Width | d |
| Steps | S1, S2, S3, S4, S5, S6 |
| Heat sink substrate | 1 |
| Laser bar | 2 |
| Clamping board | 31, 32 |
| Clamping part | 33 |
| Fixing member | 34 |

DETAILED DESCRIPTION OF THE EMBODIMENTS

In the manufacturing method for laser chip provided by the embodiment of the present disclosure, by setting a first metal coating on the epitaxial layer, and forming the pattern layer in the first metal coating and then removing the pattern layer, a micropipe is formed in the first metal coating, and the micropipe penetrates through the first metal coating. The micropipe provides space for the circulating flow of the fluid to dissipate the heat generated by the laser chip. The laser chip manufactured by this method is conducive to improving the heat dissipation effect of the laser chip on the basis of ensuring a controllable volume.

Embodiment 1

The laser chip includes an epitaxial layer, and a corresponding optical structure is formed on the epitaxial layer to finally achieve laser output. The optical structure part does not belong to the focus of the present disclosure, and will not be repeated redundantly herein, and only the part related to the present disclosure will be described in detail below.

Figure 1:
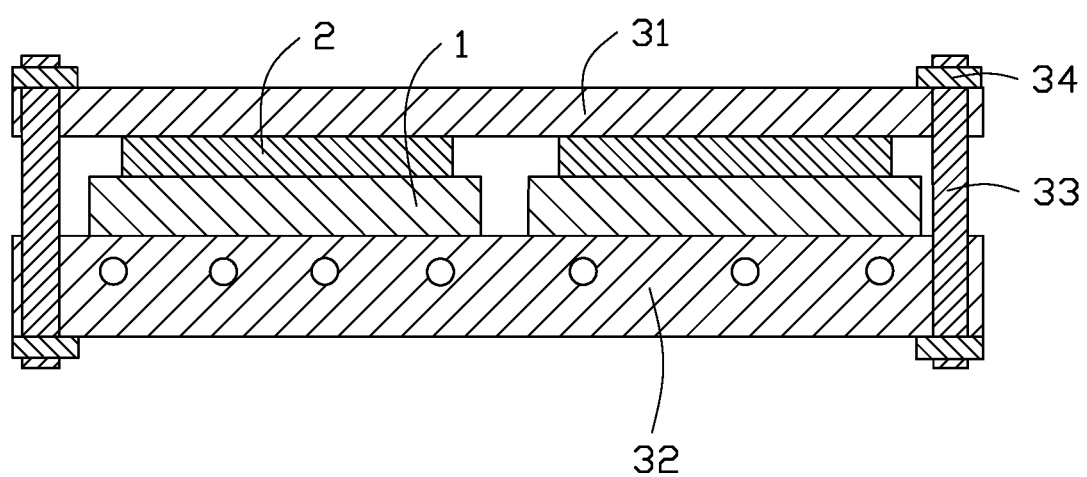
FIG. 1 is a structural schematic diagram of a laser chip provided in the background art of the present disclosure.
Figure 2:
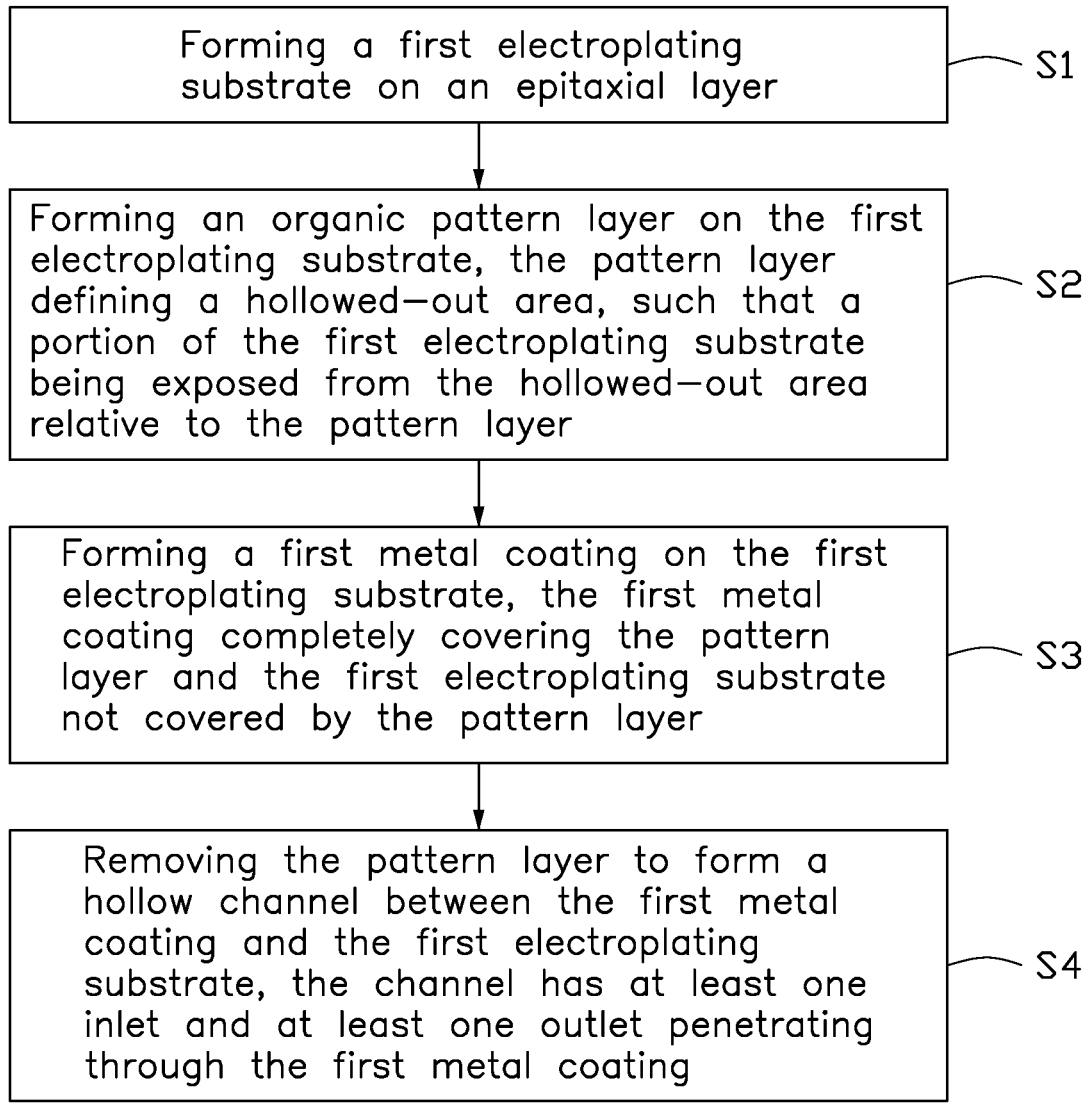
FIG. 2 is a diagram of process steps of a manufacturing method for laser chip provided in embodiment 1 of the present disclosure.

As shown in FIG. 2, the present embodiment provides a manufacturing method for laser chip, including the following steps:

step S1, forming a first electroplating layer on an epitaxial layer;

step S2, forming a pattern layer on the first electroplating layer, the pattern layer having a hollowed-out area, such that a portion of the first electroplating layer being exposed from the hollowed-out area relative to the pattern layer;

step S3, forming a first metal coating on the first electroplating layer, the first metal coating completely covering the pattern layer and the first electroplating layer not covered by the pattern layer; and step S4, removing the pattern layer to form a hollow micropipe between the first metal coating and the first electroplating layer, the micropipe has at least one inlet and at least one outlet penetrating through the first metal coating.

Figure 3A:
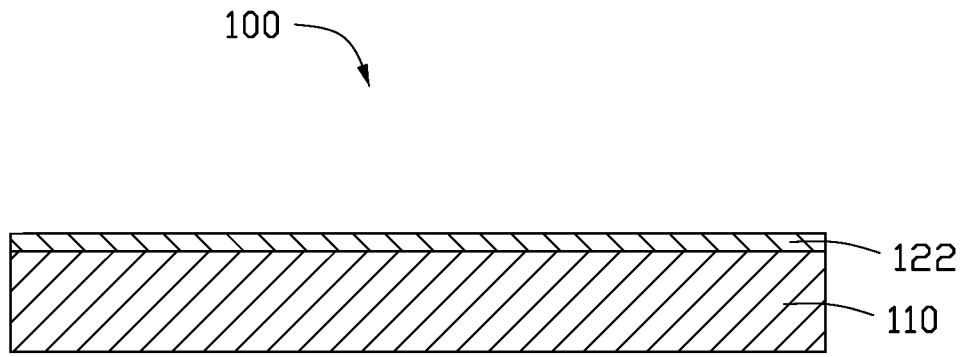
FIGS. 3A to 3B are structural schematic diagrams of the laser chip provided in embodiment 1 of the present disclosure at step S1 in the manufacturing process.
Figure 3B:
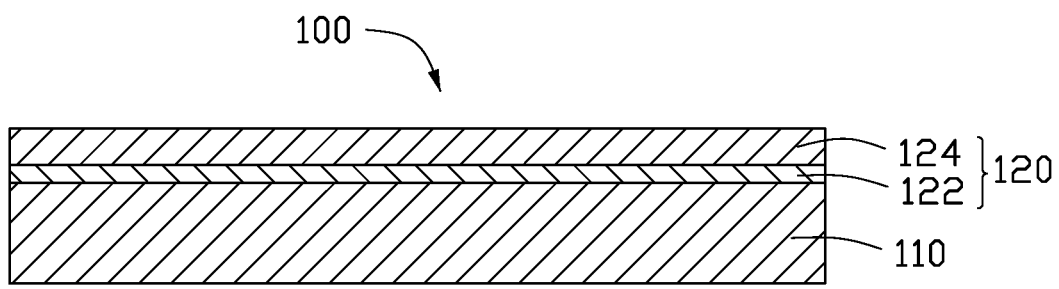

Please refer to FIG. 3A and FIG. 3B simultaneously, in step S1, a first electroplating layer 120 is formed on an epitaxial layer 110, and the first electroplating layer includes a first seed layer 122 and a second metal coating 124.

In one embodiment, the step S1 includes:

forming the first seed layer 122 on the epitaxial layer 110 by vacuum coating; and forming the second metal coating 124 on the first seed layer 122 by electroplating.

The material of the first seed layer 122 may be an alloy or metal such as Ni/Au (nickel/gold), Ni/Cu (nickel/copper), Ti/Au (titanium/gold), etc. The first seed layer 122 may be formed on the epitaxial layer 110 through sputtering deposition.

The second metal coating 124 can be a monolayer structure formed by one or more materials such as copper (Cu), nickel (Ni), silver (Ag), etc.; the second metal coating 124 can also be formed through a composite electroplating method (composite electroplating: an electroplating method is used to co-deposit solid particles with the metal, so as to obtain a composite coating on the substrate with solid particles distributed on the metal layer in a diffusing manner. This means that the insoluble solid particles are uniformly dispersed in the electroplating solution to make a suspension for electroplating. According to the characteristics of different solid particles, such as SiC which has high hardness and high temperature resistance, the solid particles are co-deposited with the electroplating base metal to obtain a functional coating related to the nature of the solid particles. The above solid particles refer to various refractory oxides, carbides, borides, nitrides, etc.), at this time, the structure of the second metal coating 124 may be a double-layer or multilayer structure such as Cu/Diamond-like carbon, W/Diamond-like carbon, Cu/SiC (silicon carbide), etc.

In other embodiments, step S1 may also include only forming the first seed layer 122 by vacuum coating, at this time, the first electroplating layer 120 only includes the first seed layer 122 and does not include the second metal coating 124.

It should be understood that the materials of the first seed layer 122 and the second metal coating 124 enumerated in the present embodiment are merely taken as examples, and are not intended to limit the present disclosure.

Figure 4:
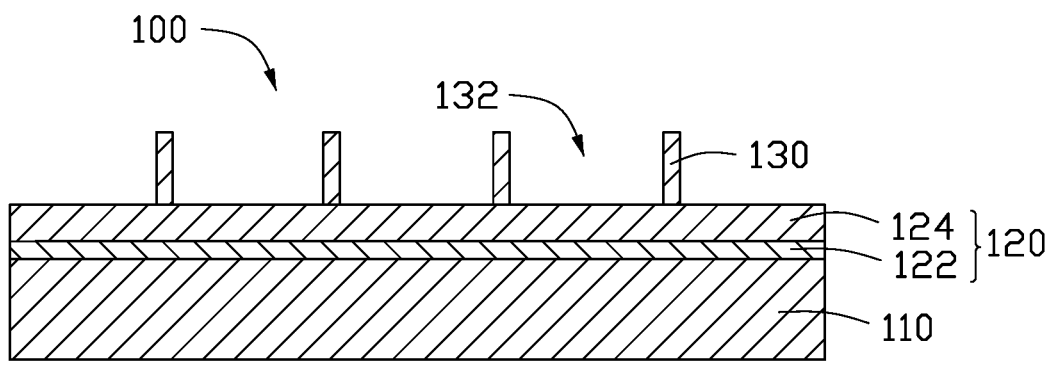
FIG. 4 is a structural schematic diagram of the laser chip provided in embodiment 1 of the present disclosure at step S2 in the manufacturing process.

Please refer to FIG. 4, in step S2, a pattern layer 130 partially covering the first electroplating layer 120 is formed on the first electroplating layer 120. The pattern layer 130 haves a hollowed-out area 132, and the hollowed-out area 132 makes a portion of the first electroplating layer 120 be exposed from the hollowed-out area relative to the pattern layer 130. Wherein, the material of the pattern layer 130 is a non-conductive organic material, such as a polyimide or photoresist material, which is formed on the first electroplating layer 120 by a dry film lithography process, and the material of the pattern layer 130 is washable by a stripping fluid, as described below specifically. In the present embodiment, wherein, the pattern layer 130 is formed on and in directly contact with the second metal coating 124.

Figure 5:
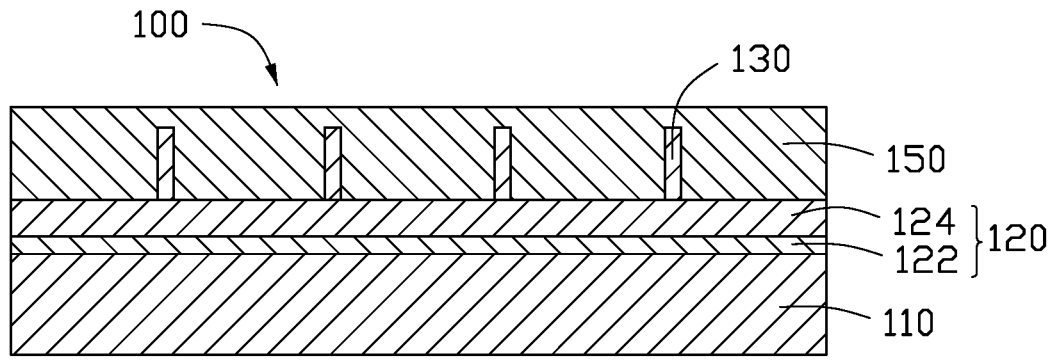
FIG. 5 is a structural schematic diagram of the laser chip provided in embodiment 1 of the present disclosure at step S3 in the manufacturing process.

Please refer to FIG. 5, as to the manufacturing method for laser chip provided in the present embodiment, in step S3, a first metal coating 150 covering the pattern layer 130 is formed on the first electroplating layer 120. The first metal coating 150 completely covers the entire pattern layer 130 and the first electroplating layer 120 not covered by the pattern layer 130, and the pattern layer 130 is embedded in the first metal coating 150.

Figure 6:
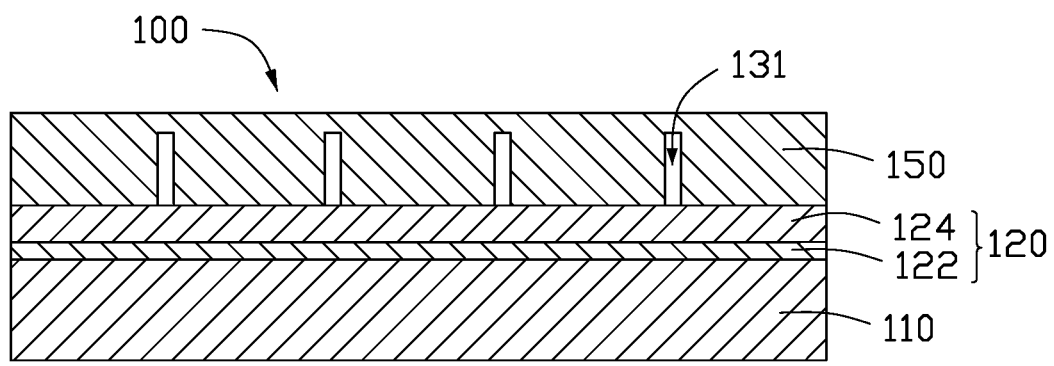
FIG. 6 is a structural schematic diagram of the laser chip provided in embodiment 1 of the present disclosure at step S4 in the manufacturing process.

Please refer to FIG. 6, in step S4, the pattern layer 130 is removed, and since the pattern layer 130 is embedded in the first metal coating 150, when the pattern layer 130 is removed, a hollow micropipe 131 is formed at the position in which the pattern layer 130, wherein the micropipe 131 is formed between the first metal coating 150 and the first electroplating layer 120. Further, the micropipe 131 is formed between the first metal coating 150 and the second metal coating 124. The master of laser chip 100 is obtained after step S4.

In one embodiment, the method of removing the pattern layer 130 can be done by directly immersing the epitaxial layer 110 formed with the first electroplating layer 120, the pattern layer 130 and the first metal coating 150 into the stripping solution to form the micropipe 131, wherein the selection of the stripping solution varies depending on the material of the pattern layer 130, and the stripping solution should be considered to minimize the impact on other layers (first metal coating 150, first electroplating layer 120).

Figure 7:
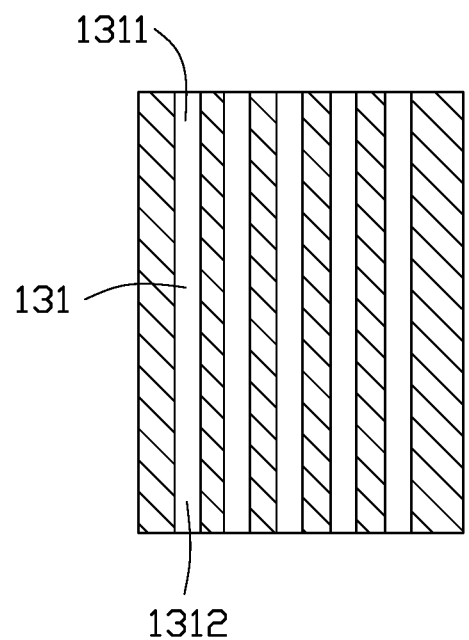
FIG. 7 is a schematic diagram of the planar structure of the micropipe in FIG. 6.

The shape of the micropipe 131 is the same as the shape of the pattern layer 130, e.g., if the pattern layer 130 formed in step S2 is a plurality of mutually parallel strips, then in step S4, the removal of the pattern layer 130 results in the formation of a plurality of strip micropipes 131 which are mutually in parallel (please refer to FIG. 7).

Figure 8:
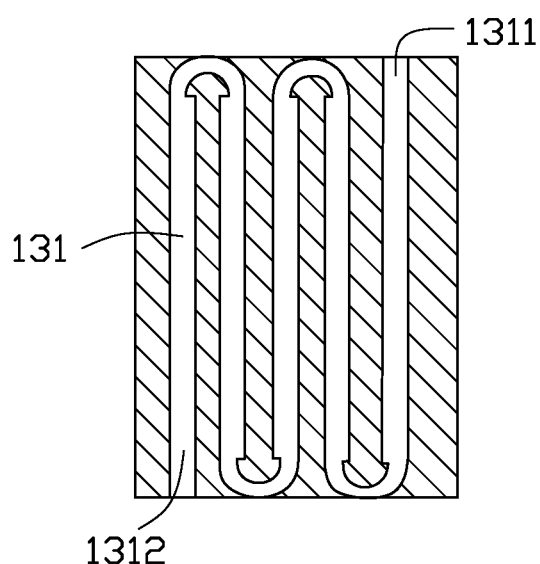
FIGS. 8 to 10 are schematic diagrams of several other planar structures of the micropipe in the laser chip provided in the present disclosure.
Figure 9:
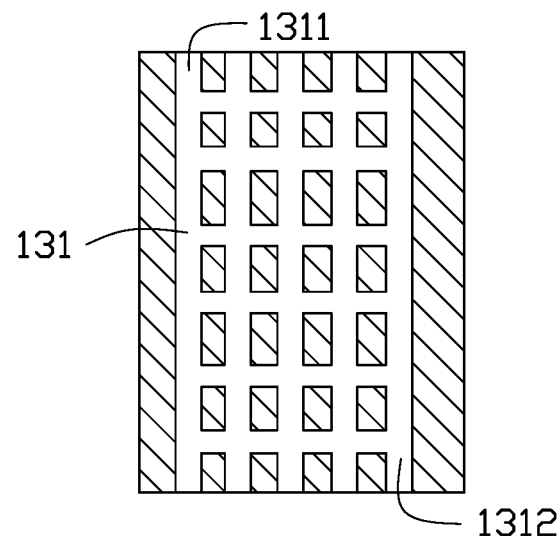
Figure 10:
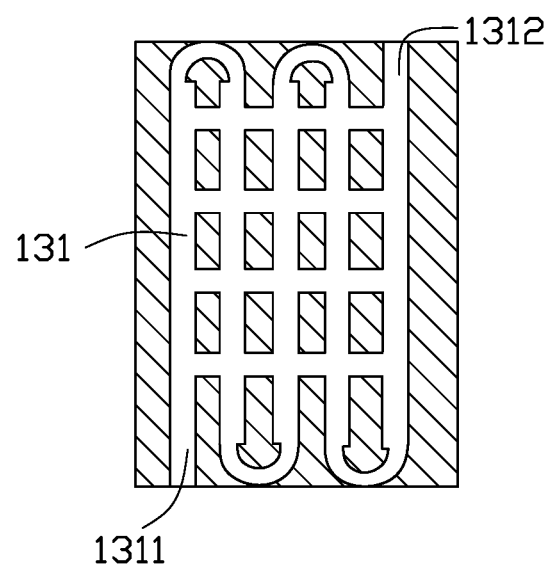

Please refer to FIG. 8 to FIG. 10, FIG. 8 to FIG. 10 show several possible shapes of the micropipe 131, in FIG. 8, the micropipe 131 is a plurality of communicated "U" shapes; in FIG. 9, the micropipe 131 is a crossed grid shape; and the shape of the micropipe 131 in FIG. 11 is a combination of FIG. 8 and FIG. 9. It should be understood that the shape of micropipe 131 as shown above is merely used as an example and does not limit the present disclosure in any way.

In addition, in order to allow the micropipe 131 to circulate the liquid and dissipate the heat generated by the laser chip, the micropipe 131 needs to have at least one inlet 1311 and at least one outlet 1312 for the circulating liquid to pass through the first metal coating 150 from the space between the inlet 1311 and the outlet 1312, so that the heat generated by the laser chip can be dissipated through the circulating liquid. Wherein, the total number of inlets 1311 and the total number of outlets 1312 in the first metal coating 150 may vary, the size of each inlet 1311 may vary, the size of each outlet 1312 may vary, and the size between the outlet 1312 and the inlet 1311 may vary. In one embodiment, the circulating fluid used to export heat may be water. The longer the micropipe 131 extends, the better the heat dissipation effect will be.

Since a micropipe 131 is formed in the first metal coating 150, the position at which the first metal coating 150 is formed with the micropipe 131 is not in direct contact with the first electroplating layer 120, and when the number of micropipes 131 is large or the micropipes occupied area is large, the contact area between the first metal coating 150 and the first electroplating layer 120 will be smaller, which will affect the adhesion between the first metal coating 150 and the first electroplating layer 120, and will further affect the adhesion between the first metal coating 150 and the epitaxial layer 110. By electroplating the second metal coating 124 on the first seed layer 122 of the first electroplating layer 120, since the second metal coating 124 and the first metal coating 150 have the same material, the adhesion between the second metal coating 124 and the first metal coating 150 is strong. By the second metal coating 124 which does not form a channel 131, the first metal coating 150 is made to adhere well to the first electroplating layer 120, which in turn makes the first metal coating 150 adhere well to the epitaxial layer 110.

Further, the epitaxial layer 110 of the laser chip 100 needs to be thinned and polished, so that the surface of the epitaxial layer 110 has a high degree of flatness and smoothness.

Figure 11A:
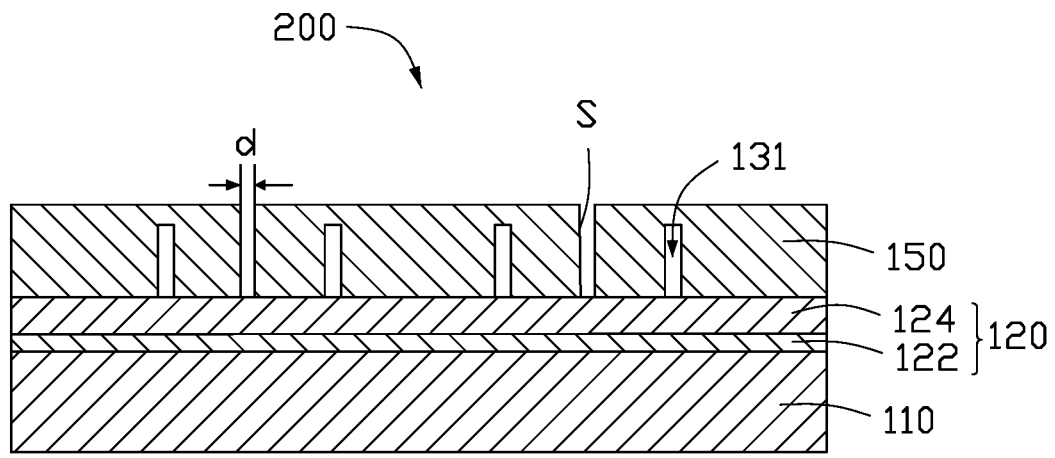
FIGS. 11A to 11B are structural schematic diagrams of the laser chip provided in embodiment 1 of the present disclosure at step S5 in the manufacturing process.
Figure 11B:
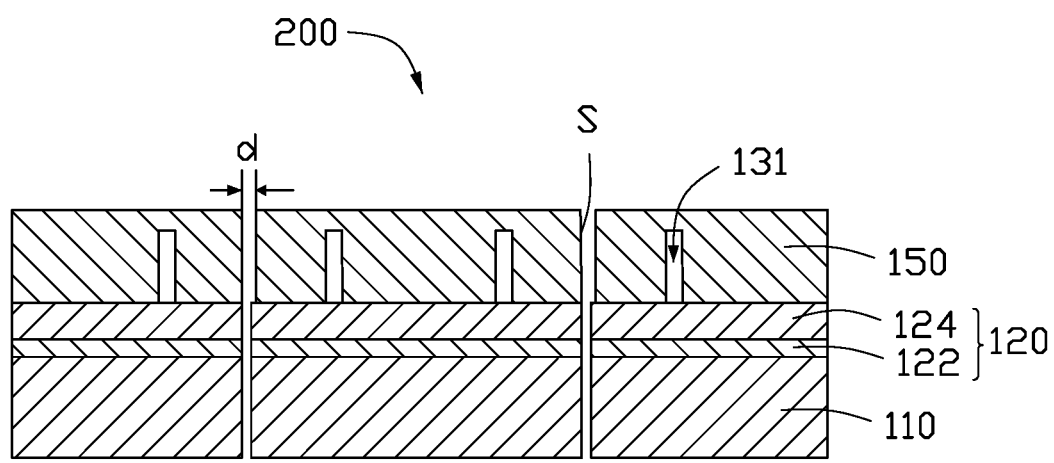

Please refer to FIG. 11A to FIG. 11B, in one embodiment, the manufacturing method for laser chip further includes the following steps:

step S5, cutting the epitaxial layer and the other layers formed on the epitaxial layer (including the first electroplating layer, the pattern layer and the first metal coating, etc.), to form a plurality of separated laser chips 200, the micropipe 131 of each laser chip 200 has at least one inlet and at least one outlet penetrating through the first metal coating 150;

Please refer to FIG. 11A to FIG. 11B continuously, in the present embodiment, in step S5, the master of laser chip 100 is cut, including two processes of cutting the first metal coating 150 (FIG. 11A) and the epitaxial layer 110 with different materials (FIG. 11B), respectively.

Wherein, a photolithographic etching process can be used to cut the first metal coating 150, and laser, cutting saw, waterjet and other cutting processes can also be used, the width d of the notch 154 of etching or cutting the first metal coating 150 needs to be less than 20 microns, and in order to form a notch 154 in this step to facilitate the subsequent cutting of the epitaxial layer 110, the depth of the cut 154 should be selected to the same as the thickness of the first metal coating 150. Then, the epitaxial layer 110 will not be damaged when the first metal coating 150 is cut, but also the subsequent cleaving process of the epitaxial layer 110 along the direction of the notch 154 formed on the first metal coating 150 is facilitated.

In one embodiment, as shown in FIG. 11B, the epitaxial layer 110 is cut by a cleaving process, and a plurality of laser chips 200 are formed after cutting. The laser chips 200 formed after cutting have a cutting end face S. The coating film is coated to the cutting end face S and to the end face opposite to the cutting end face S. For example, it can be a diamond knife cleavage, and is separated along an easily cleaved surface of the lattice of the epitaxial layer 110, and the produced cutting end face S is smooth, or dry etching or wet etching can also be used with other post-processing to produce a flat cutting end face S.

Figure 12:
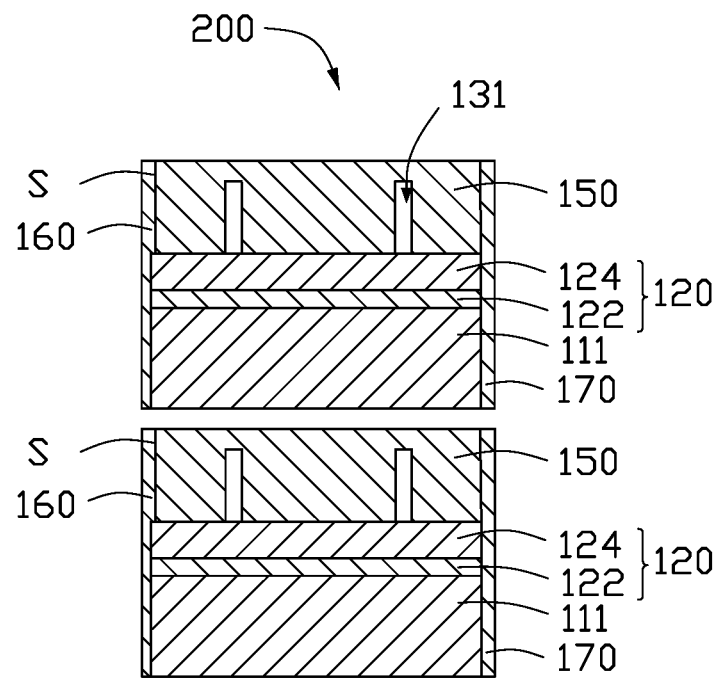
FIG. 12 is a structural schematic diagram of the laser chip provided in embodiment 1 of the present disclosure at step S6 in the manufacturing process.

Please refer to FIG. 12, in one embodiment, the manufacturing method for laser chip can further include the following steps:

step S6, coating a film layer on the cutting end face on each laser chip, wherein the film layer can be a highly reflective film or a highly transparent film.

In step S6, the cutting end face S of each laser chip 200 and the end face opposite to the cutting end face S are coated to form a film layer. In the present embodiment, the film layer 160 and the film layer 170 are coated on the two cutting end faces S on the laser chip 200, one of which is a highly anti-reflective film and the other is a highly reflective film. In one embodiment, in order to improve the coating process efficiency, multiple laser chips 200 can be stacked together for coating (in FIG. 12, two laser chips 200 are stacked), which can reduce the total coating process time.

In the manufacturing method for laser chip provided by the embodiment of the present disclosure, by setting a first metal coating 150 on the epitaxial layer 110, and forming the pattern layer 130 in the first metal coating 150 and then removing the pattern layer 130, the micropipe 131 is formed in the first metal coating 150, and the micropipe 131 penetrates through the first metal coating 150, then the micropipe 131 serves as a space for the circulating liquid, and the heat generated by the laser chip 200 is dissipated by the circulating liquid. The laser chip 200 made by the method is conducive to improving the heat dissipation effect of the laser chip 200 on the basis of ensuring a controllable volume.

Embodiment 2

The manufacturing method for laser chip provided in the present embodiment differs from embodiment 1 in step S3.

Figure 13A:
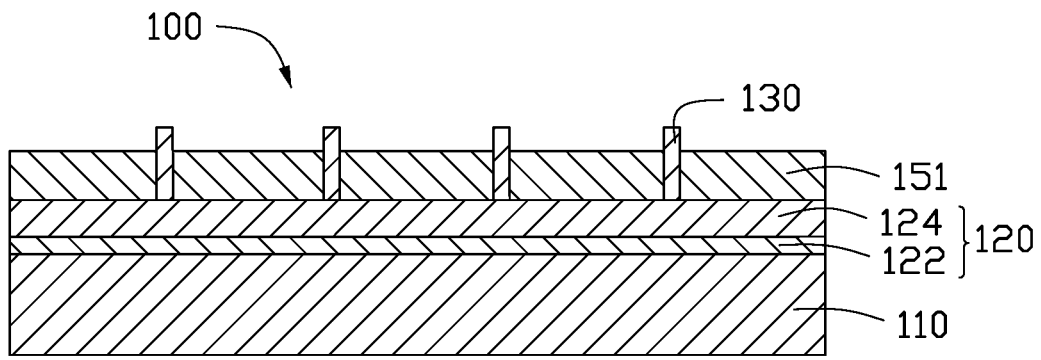
FIGS. 13A to 13C are structural schematic diagrams of the laser chip provided in embodiment 2 of the present disclosure at step S3 in the manufacturing process.

Due to the size requirement of the finally formed micropipe 131, the height of the pattern layer 130 needs to meet the same size as the micropipe, and the first metal coating 150 needs to cover the pattern layer 130 completely, and only one electroplating may not be able to form a better coverage effect, or in the proximity of the pattern layer 130 and the hollowed-out area 132, the thickness of the first metal coating 150 is not uniform, therefore, the above problem is solved by adopting multiple electroplating to form the first metal coating 150 in the present embodiment. Please refer to FIG. 13A to FIG. 13C at the same time, in the present embodiment, step S3 includes:

as shown in FIG. 13A, a first sub-electroplating layer 151 is formed by electroplating on the first electroplating layer 120, the first sub-electroplating layer 151 covers the portion of the first electroplating layer 120 not covered by the pattern layer 130, the first sub-electroplating layer 151 is not formed on the pattern layer 130, and the pattern layer 130 is partially embedded in the first sub-electroplating layer 151 and is exposed relative to the first sub-electroplating layer 151.

Figure 13B:
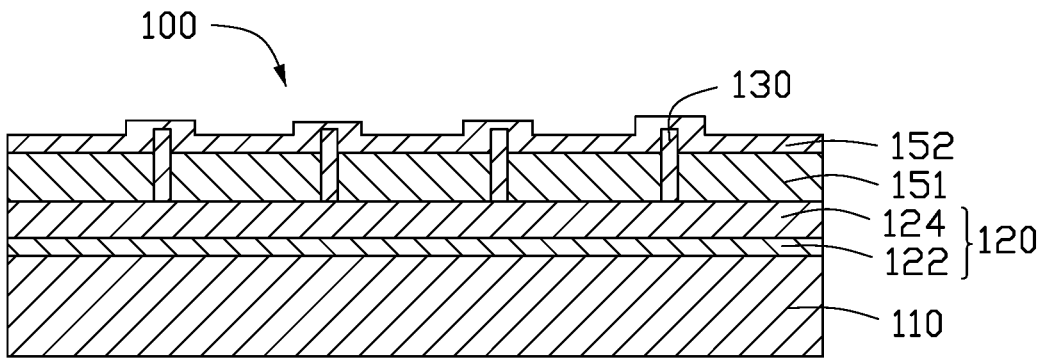
Figure 13C:
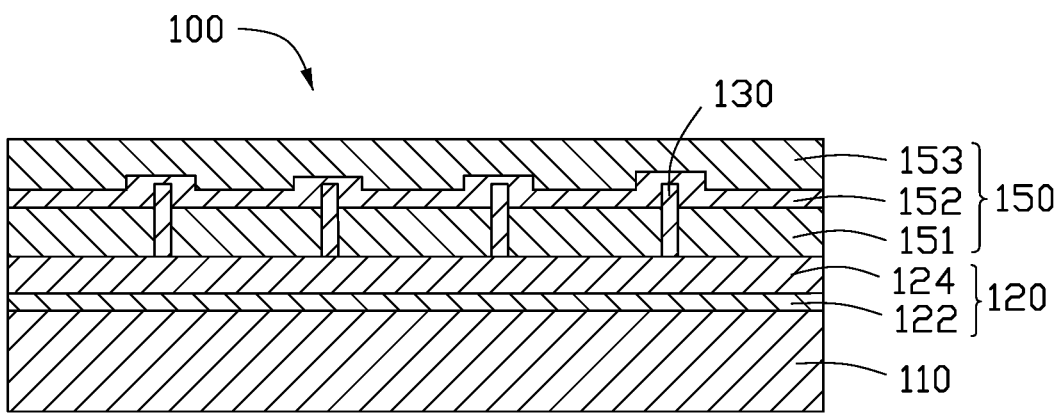

As shown in FIG. 13B, a second seed layer 152 covering the pattern layer 130 and the first sub-electroplating layer 151 is formed by vacuum coating;

as shown in FIG. 13C, a second sub-electroplating layer 153 covering the second seed layer 152 is formed by electroplating.

In the present embodiment, the pattern layer 130 is completely jointly covered by the first sub-electroplating layer 151 and the second seed layer 152. It will be appreciated that in other embodiments, a combination of the first sub-electroplating layer 151 and the second seed layer 152 does not completely cover the pattern layer 130, but rather a combination of the first sub-electroplating layer 151, the second seed layer 152, and the second sub-electroplating layer 153 completely cover the pattern layer 130.

Wherein in one embodiment, the first sub-electroplating layer 151 and the second sub-electroplating layer 153 have the same electroplating material as the second metal coating 124, and the second seed layer 152 has the same material and the same formation method as the first seed layer 122.

Figure 14:
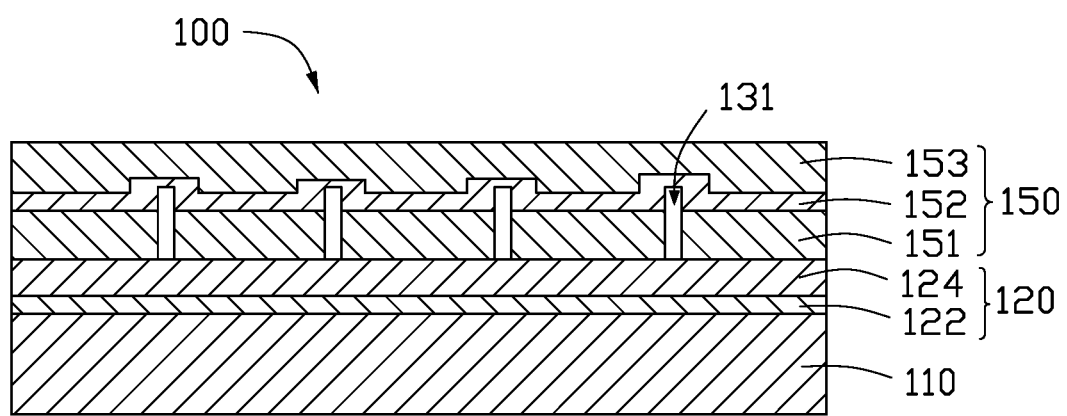
FIG. 14 is a structural schematic diagram of the laser chip provided in embodiment 2 of the present disclosure at step S4 in the manufacturing process.

Please refer to FIG. 14, in step S4, the pattern layer 130 is removed and a hollow micropipe 131 is formed at the position in which the pattern layer 130 is originally formed. The shape of the micropipe 131 is the same as the shape of the pattern layer 130 (please refer to FIG. 7 to FIG. 10). In addition, in order to allow the micropipe 131 to circulate the liquid and dissipate the heat generated by the laser chip, the micropipe 131 needs to have at least one inlet 1311 and at least one outlet 1312.

Further, the epitaxial layer 110 of the laser chip needs to be thinned and polished, so that the surface of the epitaxial layer 110 has a high degree of flatness and smoothness.

Figure 15A:
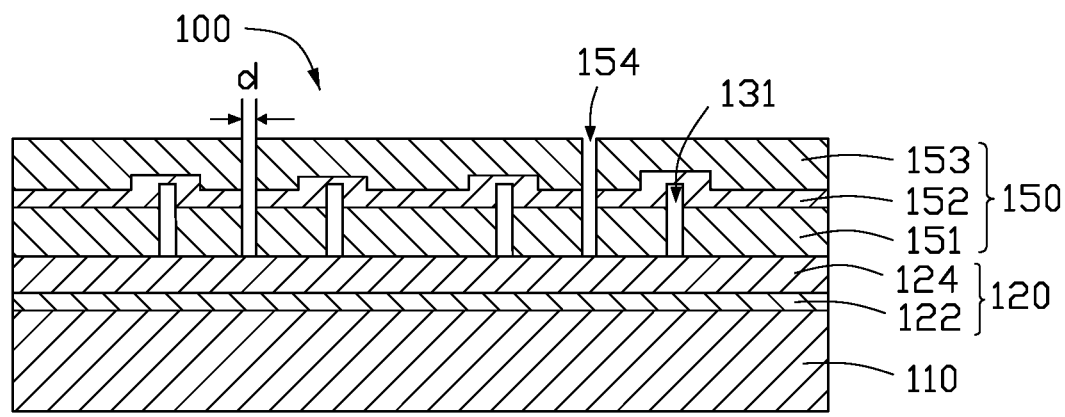
FIGS. 15A to 15B are structural schematic diagrams of the laser chip provided in embodiment 2 of the present disclosure at step S5 in the manufacturing process.
Figure 15B:
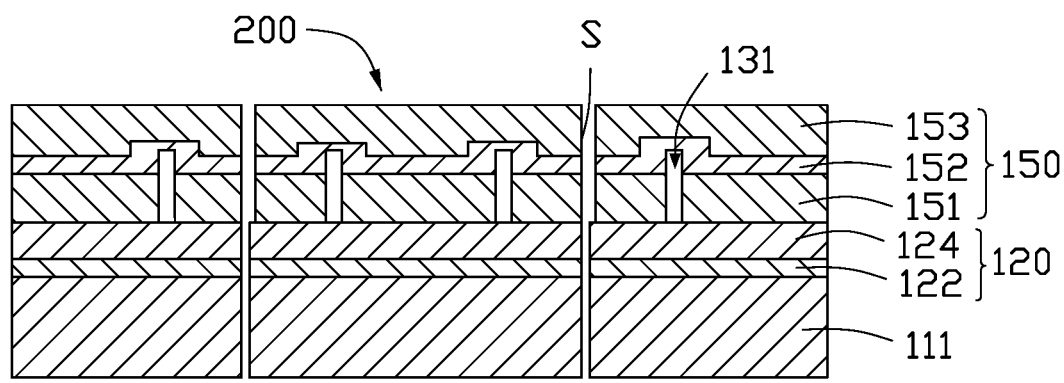
Figure 16:
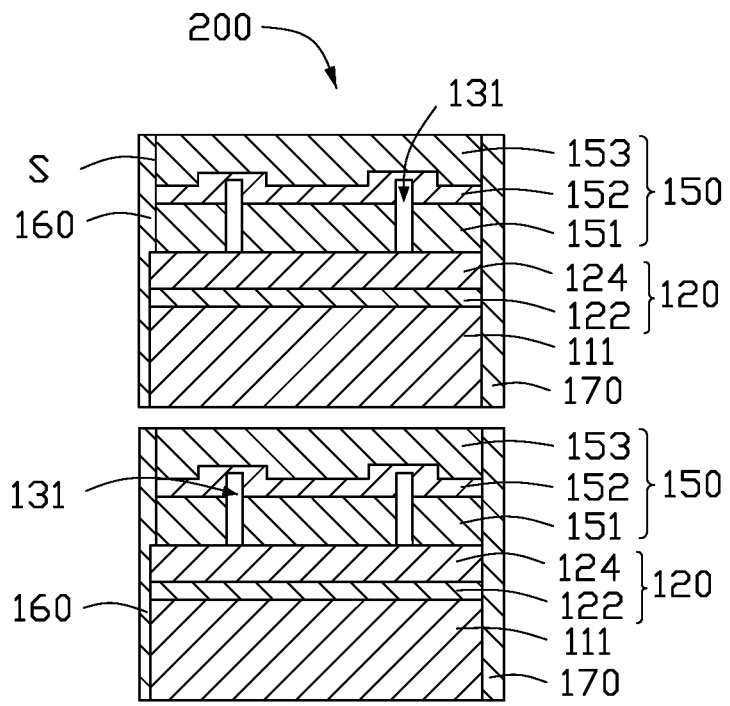
FIG. 16 is a structural schematic diagram of the laser chip provided in embodiment 2 of the present disclosure at step S6 in the manufacturing process.

Please refer to FIG. 15A to FIG. 15B, in one embodiment, the manufacturing method for laser chip further includes the following steps:

step S5, cutting the epitaxial layer and the layers formed on the epitaxial layer (including the first electroplating layer, the pattern layer and the first metal coating, etc.), to form a plurality of separated laser chips 200, wherein the micropipe 131 of each laser chip 200 has at least one inlet and at least one outlet penetrating through the first metal coating 150;

please refer to FIG. 16, in one embodiment, the manufacturing method for laser chip further includes the following steps:

step S6, coating the cutting end faces on each laser chip with a film layer, wherein the film layer may be a highly reflective film or a highly transparent film.

Since the steps before step S3 and after step S3 of the manufacturing method for laser chip provided in the embodiment of the present disclosure are similar to the corresponding steps in embodiment 1, they will not be repeated redundantly in the present embodiment.

It should be understood that the manufacturing method for laser chip provided in the present embodiment achieves all the beneficial effects as described in embodiment 1, and on this basis, since the first metal coating 150 is formed by electroplating twice, the thickness uniformity of the first metal coating 150 close to the top surface of the pattern layer 130 is improved.

Embodiment 3

The laser chip in the present embodiment includes an epitaxial layer, wherein a corresponding optical structure is formed on the epitaxial layer to finally achieve laser output. Only the structures related to the present disclosure will be described in detail below.

Figure 17:
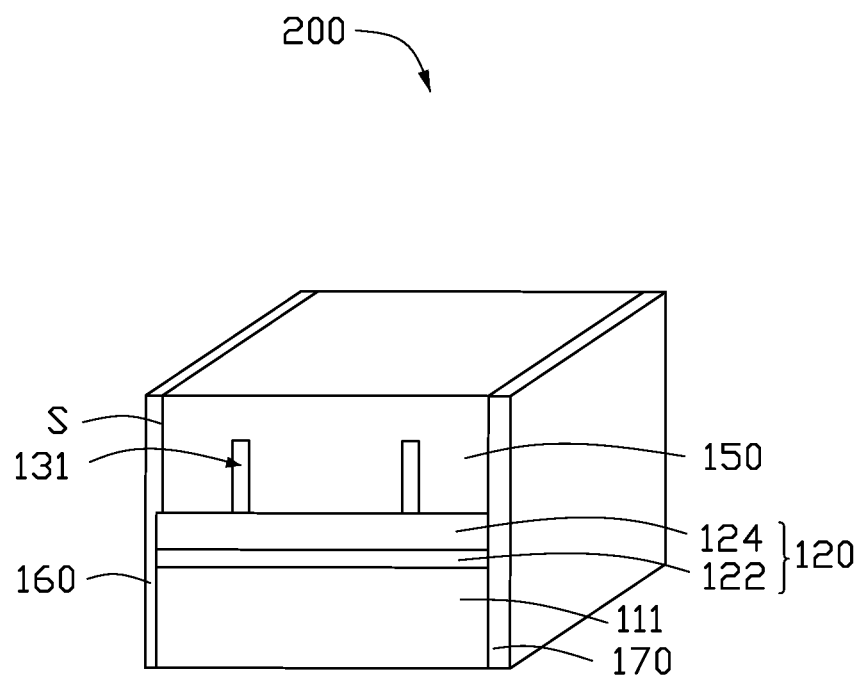
FIG. 17 is a schematic diagram of the three-dimensional structure of a laser chip provided in embodiment 3 of the present disclosure.

Please refer to FIG. 17, the laser chip 200 provided in the present embodiment includes:

an epitaxial layer 110;

a first electroplating layer 120 formed on the epitaxial layer 110; and a first metal coating 150 formed on the first electroplating layer 120, wherein a hollow micropipe 131 is formed in the first metal coating 150, and the micropipe 131 is configured to provide circulation space for circulating liquid, to export heat from the laser chip 200 by circulating liquid.

Wherein, the epitaxial layer 110 is a semiconductor material. The first electroplating layer 120 may be formed on the epitaxial layer 110 using sputtering deposition.

In the present embodiment, the first electroplating layer 120 includes a first seed layer 122 formed on the epitaxial layer 110 and a second metal coating 124 formed on the first seed layer 122. The pattern layer 130 is formed on the second metal coating 124 and partially covers the second metal coating 124. In another embodiment, the second metal coating 124 may also be omitted. The material of the first seed layer 122 can be an alloy or metal such as Ni/Au (nickel/gold), Ni/Cu (nickel/copper), Ti/Au (titanium/gold), etc.; the second metal coating 124 is formed by electroplating and can be a monolayer structure formed by one or more materials such as copper (Cu), nickel (Ni), gold (Au), etc.; or it can be a composite electroplating manner, at this time, the structure of the second metal coating 124 can be Cu/diamond-like carbon, W/diamond-like carbon, Cu/SiC (silicon nitride), and other double or multi-layer structures.

It should be understood that the materials of the first seed layer 122 and the second metal coating 124 enumerated in the present embodiment are merely used for examples and are not intended to limit the present disclosure.

The first metal coating 150 includes a first sub-electroplating layer 151, a second sub-electroplating layer 153, and a second seed layer 152 formed between the first sub-electroplating layer 151 and the second sub-electroplating layer 153. The micropipe 131 is formed in the first sub-electroplating layer 151 and the second seed layer 152.

Wherein, the first sub-electroplating layer 151 and the second sub-electroplating layer 153 are made of the same material as the second metal coating 124, and the second seed layer 152 is made of the same material as the first seed layer 122, which will not be enumerated herein.

The micropipe 131 may be one or more. The form of the micropipe 131 may be various, for example, the micropipe 131 may be a pattern of several long strips parallel to each other, or a continuous arc, etc., please refer to the forms listed in FIGS. 7 to 10. In one embodiment, if the number of micropipes 131 is multiple, the multiple micropipes 131 on the same laser chip 200 may also be of different forms, but generally, in consideration of the complexity of the process of forming the pattern layer 130, the multiple micropipes 131 on the same laser chip 200 are preferably to be of the same form.

In addition, in order to make the micropipe 131 allow the circulating liquid to flow and export the heat generated by the laser chip 200, the micropipe 131 should be a continuous micropipe 131 penetrating through the first metal coating 150, which needs to have at least one inlet 1311 and at least one outlet 1312 for the circulating liquid to pass through the first metal coating 150 from the space between the inlet 1311 and the outlet 1312, that is, heat generated by the laser chip 200 can be exported through the circulating liquid. Wherein, the total number of inlets 1311 and the total number of outlets 1312 in the first metal coating 150 may be different, the size of each inlet 1311 may be different, the size of each outlet 1312 may be different, and the size between the outlet 1312 and the inlet 1311 may also be different. In one embodiment, the circulating fluid used to export heat may be water. The longer the micropipe 131 extends, the better the heat dissipation effect will be.

Since a micropipe 131 is formed in the first metal coating 150, the position at which the first metal coating 150 is formed with the micropipe 131 is not in direct contact with the first electroplating layer 120, and when the number of micropipes 131 is large or the occupied area is large, the contact area between the first metal coating 150 and the first electroplating layer 120 will be smaller, which will affect the adhesion between the first metal coating 150 and the first electroplating layer 120, and will further affect the adhesion between the first metal coating 150 and the epitaxial layer 110. By electroplating the second metal coating 124 on the first seed layer 122 of the first electroplating layer 120, since the second metal coating 124 and the first sub-electroplating layer 151 of the first metal coating 150 are made of the same material, the adhesion between the two is strong. By the second metal coating 124 which does not form a micropipe 131, the first metal coating 150 is made to adhere well to the first electroplating layer 120, which in turn makes the first metal coating 150 adhere well to the epitaxial layer 110.

In the present embodiment, the laser chip 200 also includes a film layer 160 and a film layer 170, since the laser chip 200 is formed by cutting, a cutting end face S will be formed during cutting, a film layer 160 and a film layer 170 are respectively coated on the cutting end face S and the end face opposite to the cutting end face S, in the present embodiment, one of the film layer 160 and the film layer 170 on the laser chip 200 is a highly anti-reflective film, and the other is a highly reflective film.

As to the laser chip 200 provided in the embodiment of the present disclosure, through forming a first metal coating 150 on the epitaxial layer 110 of the laser chip 200, and forming a micropipe 131 in the first metal coating 150, the micropipe 131 penetrates through the first metal coating 150, then the micropipe 131 serves as a space for the circulating liquid to flow, and the heat generated by the laser chip 200 is exported by the circulating liquid, which is conducive to maintaining a good heat dissipation effect while keeping a small overall volume of the laser chip 200.

Embodiment 4

Figure 18:
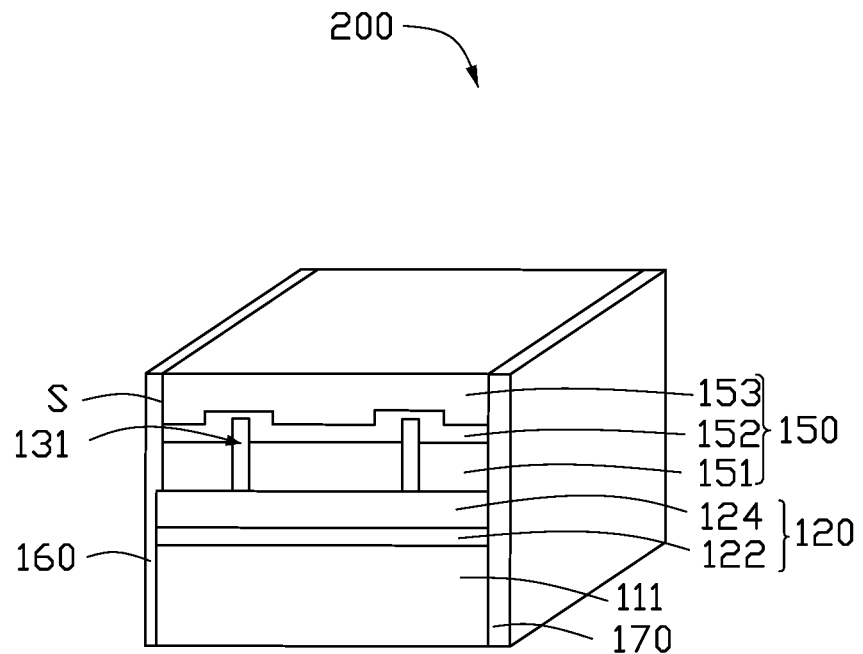
FIG. 18 is a schematic diagram of the three-dimensional structure of the laser chip provided in embodiment 4 of the present disclosure.

Please refer to FIG. 18, and the laser chip 200 provided in the present embodiment differs from that in embodiment 3 as follows:

Due to the size requirement of the finally formed micropipe 131, the height of the pattern layer 130 needs to meet the same size as the micropipe, and the first metal coating 150 needs to cover the pattern layer 130 completely, and only one electroplating may not form a better coverage effect, or the thickness of the first metal coating 150 is not uniform in the places near the pattern layer 130 and the hollowed-out area 132, therefore, in the present embodiment, two electroplating is adopted to form the first metal coating 150 to solve the above problem.

Therefore, in the present embodiment, the first metal coating 150 includes a first sub-electroplating layer 151, a second sub-electroplating layer 153 and a second seed layer 152 formed between the first sub-electroplating layer 151 and the second sub-electroplating layer 153. The micropipe 131 is formed in the first sub-electroplating layer 151 and the second seed layer 152.

Wherein, the first sub-electroplating layer 151 and the second sub-electroplating layer 153 are made of the same material as the second metal coating 124, and the second seed layer 152 is made of the same material as the first seed layer 122, which will not be enumerated herein.

It should be understood that the laser chip 200, as provided in the present embodiment, can achieve all of the beneficial effects as described in embodiment 3, and on this basis, the first metal coating 150 forms in two circuits the first sub-electroplating layer 151 and the second sub-electroplating layer 153, respectively, thereby improving the thickness uniformity of the first metal coating 150 near the top surface of the pattern layer 130.

The above is only an implementation of the present disclosure, not to limit the scope of the patent of the present disclosure. Any equivalent structure or equivalent process transformation made by using the specification of the present disclosure and the accompanying drawings or applied directly or indirectly in other related technical fields, is included in the patent protection scope of the present disclosure in the same way.

The invention claimed is:

1. A manufacturing method for laser chip, comprising the following steps:
    step S1, forming a first electroplating layer on an epitaxial layer;
    step S2, forming a pattern layer on the first electroplating layer, the pattern layer having a hollowed-out area, a portion of the first electroplating layer being exposed from the pattern layer through the hollowed-out area;
    step S3, forming a first metal coating on the first electroplating layer, the first metal coating completely covering the pattern layer and the first electroplating layer not covered by the pattern layer; and
    step S4, removing the pattern layer to form a hollow micropipe between the first metal coating and the first electroplating layer, the hollow micropipe having at least one inlet and at least one outlet penetrating through the first metal coating.

2. The manufacturing method for laser chip of claim 1, wherein the first electroplating layer comprises a first seed layer of metal and a second metal coating, and the step S1 comprises:
    forming the first seed layer on the epitaxial layer by vacuum coating; and
    forming the second metal coating on the first seed layer by electroplating, wherein the pattern layer is formed directly on the second metal coating, and the micropipe the hollow micropipe is formed between the first metal coating and the second metal coating.

3. The manufacturing method for laser chip of claim 1, wherein the first metal coating comprises a first sub-electroplating layer, a second seed layer and a second sub-electroplating layer; and the step S3 comprises:
    forming the first sub-electroplating layer by electroplating on the first electroplating layer, wherein the first sub-electroplating layer covers the portion of the first electroplating layer not covered by the pattern layer, and does not cover the pattern layer;
    forming the second seed layer covering the pattern layer and the first sub-electroplating layer by vacuum coating; and
    forming the second sub-electroplating layer covering the second seed layer by electroplating.

4. The manufacturing method for laser chip of claim 1, wherein removing the pattern layer comprises;
    dipping into a stripping solution to dissolve the pattern layer;
    wherein a shape of the hollow micropipe is the same as a shape of the pattern layer.

5. The manufacturing method for laser chip of claim 1, further comprising:
    step S5, cutting the epitaxial layer and each layer formed on the epitaxial layer to form a plurality of separated laser chips, wherein the hollow micropipe of each of the plurality of laser chips has at least one inlet and at least one outlet penetrating through the first metal coating, each of the plurality of laser chips has at least one cutting end face; and
    step S6, coating the cutting end face with a film layer, wherein the film layer may be a highly reflective film or a highly transparent film.

6. A laser chip, comprising:
    an epitaxial layer;
    a first electroplating layer on the epitaxial layer; and
    a first metal coating on the first electroplating layer, a hollow micropipe being between the first metal coating and the first electroplating layer, and the hollow micropipe having at least one inlet and at least one outlet penetrating through the first metal coating.

7. The laser chip of claim 6, wherein the hollow micropipe is provided with circulating fluid, the circulating fluid enters from the inlet and exits from the outlet to export heat in the laser chip.

8. The laser chip of claim 6, wherein
    the first electroplating layer comprises a first seed layer formed by vacuum coating and a second metal coating formed by electroplating, and the the hollow micropipe is formed between the first metal coating and the second metal coating.

9. The laser chip of claim 6, wherein the first metal coating comprises a first sub-electroplating layer, a second seed layer of metal and a second sub-electroplating layer.

10. The laser chip of claim 9, wherein the first sub-electroplating layer, the first electroplating layer comprises a second metal coating, the first sub-electroplating layer, the second sub-electroplating layer and the second metal coating are of the same material.

* * * * *